(12) United States Patent
Wang

(10) Patent No.: US 12,332,672 B2
(45) Date of Patent: Jun. 17, 2025

(54) APPARATUS, METHOD AND SYSTEM FOR ADJUSTING VOLTAGE STABILIZATION OUTPUT OF POWER SOURCE

(71) Applicant: Changchun Jetty Automotive Technology Co., Ltd., Changchun (CN)

(72) Inventor: Chao Wang, Changchun (CN)

(73) Assignee: CHANGCHUN JETTY AUTOMOTIVE TECHNOLOGY CO., LTD., Changchun (CN)

( * ) Notice: Subject to any disclaimer, the term of this patent is extended or adjusted under 35 U.S.C. 154(b) by 272 days.

(21) Appl. No.: 18/035,691

(22) PCT Filed: Jul. 8, 2021

(86) PCT No.: PCT/CN2021/105194
§ 371 (c)(1),
(2) Date: May 5, 2023

(87) PCT Pub. No.: WO2022/105254
PCT Pub. Date: May 27, 2022

(65) Prior Publication Data
US 2023/0409059 A1    Dec. 21, 2023

(30) Foreign Application Priority Data
Nov. 17, 2020    (CN) .......................... 202011286849.1

(51) Int. Cl.
*G05F 1/56* (2006.01)
*G01R 19/25* (2006.01)
*H03M 1/12* (2006.01)

(52) U.S. Cl.
CPC ........... *G05F 1/56* (2013.01); *G01R 19/2509* (2013.01); *H03M 1/12* (2013.01)

(58) Field of Classification Search
CPC ........ G05F 1/56; G01R 19/2509; H03M 1/12; H02M 1/0003
See application file for complete search history.

(56) References Cited

U.S. PATENT DOCUMENTS

| | | | |
|---|---|---|---|
| 2004/0207377 A1 | 10/2004 | Shimada et al. | |
| 2013/0132451 A1* | 5/2013 | Takahashi | H02M 3/157 708/200 |

(Continued)

FOREIGN PATENT DOCUMENTS

| | | |
|---|---|---|
| CN | 101917119 A | 12/2010 |
| CN | 104467470 A | 3/2015 |

(Continued)

OTHER PUBLICATIONS

Extended Search Report for counterpart European Application No. 21893406.5, Sep. 10, 2024.

(Continued)

*Primary Examiner* — Adolf D Berhane
*Assistant Examiner* — Afework S Demisse
(74) *Attorney, Agent, or Firm* — LOZA & LOZA, LLP; Michael F. Fedrick

(57) ABSTRACT

An apparatus, method and system for adjusting a voltage stabilization output of a power source (10). The power source (10) forms an output voltage based on a supply current. The apparatus includes a sampling module (11), a PID adjustment module (12) and a control module (13). The sampling module (11) is configured to sample the output voltage of the power source (10) to obtain a sampled voltage (S100). The PID adjustment module (12) is configured to obtain a switching frequency signal by PID control adjustment based on the sampled voltage and a preset control parameter. The PID control adjustment includes a voltage loop control adjustment and a voltage-difference-change-rate loop control adjustment (S200). The control module (Continued)

(13) is configured to form the supply current according to the switching frequency signal (S300). The voltage stabilization output of the power source (10) can be realized.

14 Claims, 4 Drawing Sheets

(56) References Cited

U.S. PATENT DOCUMENTS

| | | | |
|---|---|---|---|
| 2015/0280590 A1* | 10/2015 | Maede | H02M 3/33515 363/21.06 |
| 2016/0359410 A1 | 12/2016 | Kumasaka et al. | |
| 2023/0409059 A1 | 12/2023 | Wang | |

FOREIGN PATENT DOCUMENTS

| | | | |
|---|---|---|---|
| CN | 105610302 | A | 5/2016 |
| CN | 205377652 | U | 7/2016 |
| CN | 107104593 | A | 8/2017 |
| CN | 207069907 | U | 3/2018 |
| CN | 109856961 | A | 6/2019 |
| CN | 110687955 | A | 1/2020 |
| CN | 111193402 | A | 5/2020 |
| CN | 112445259 | A | 3/2021 |
| EP | 4250053 | A1 | 9/2023 |
| JP | 2000152616 | A | 5/2000 |
| JP | 2005183038 | A | 7/2005 |
| JP | 2015095935 | A | 5/2015 |
| JP | 2016140168 | A | 8/2016 |
| JP | 2017005774 | A | 1/2017 |
| JP | 2018527879 | A | 9/2018 |
| JP | 2023549216 | A | 11/2023 |
| KR | 20160001070 | A | 1/2016 |
| WO | 2022105254 | A1 | 5/2022 |

OTHER PUBLICATIONS

First Office Action & Search Report for counterpart Canadian Application No. 3199116, Oct. 15, 2024.
Sharma et al. "Design of Digital PID Controller for Voltage Mode Control of DC-DC Converters." 2017 international conference on microelectronic devices, circuits and systems (ICMDCS). IEEE, 2017.
First Office Action issued on Jun. 18, 2024 for counterpart Japanese Patent Application No. 2023-528415.
International search report for corresponding Chinese patent application No. PCT/CN2021/105194, dated Aug. 26, 2021.
First Office Action and search report issued on Dec. 17, 2021 for counterpart Chinese Patent Application No. 202011286849.1, along with machine translation into English.

* cited by examiner controlling, according to the switching frequency signal, the switching element Q to conduct or cut off a path between a power source end VDD and a supply current output end OUT2 to form a supply current — S310

APPARATUS, METHOD AND SYSTEM FOR ADJUSTING VOLTAGE STABILIZATION OUTPUT OF POWER SOURCE

CROSS-REFERENCE TO RELATED APPLICATIONS

This application is the U.S. national stage of International Patent Application No. PCT/CN2021/105194, filed on Jul. 8, 2021, which claims the benefit of priority under 35 U.S.C. § 119 to Chinese Patent Application No. 202011286849.1, filed on Nov. 17, 2020, entitled "Apparatus, method and system for adjusting voltage stabilization output of power source", both of which are hereby incorporated by reference in its entirety.

TECHNICAL FIELD

The present disclosure relates to a technical field of power electronic equipment, and particularly to an apparatus, method and system for adjusting a voltage stabilization output of a power source.

BACKGROUND

The power source in power and electronic devices serves as an energy supply apparatus, and its use safety and reliability are particularly important. In order to ensure the electricity safety of the power source, a stable power supply is required to achieve a stable output of the power source. The unstable output of the power supply is likely to cause short circuit and other situations and result in potential safety hazards, thereby causing damages to devices such as the power source and leading to huge economic losses and casualties.

SUMMARY

An objective of the present disclosure is to provide an apparatus for adjusting a voltage stabilization output of a power source, so as to realize the voltage stabilization output of the power source. Another objective of the present disclosure is to provide a system for adjusting a voltage stabilization output of a power source. Still another objective of the present disclosure is to provide a method for adjusting a voltage stabilization output of a power source. Yet another objective of the present disclosure is to provide a computer device. Yet still another objective of the present disclosure is to provide a readable medium.

In order to achieve the above objectives, an aspect of the present disclosure discloses an apparatus for adjusting a voltage stabilization output of a power source. The power source forms an output voltage based on a supply current. The apparatus includes a sampling module, a PID adjustment module and a control module. The sampling module is configured to sample the output voltage of the power source to obtain a sampled voltage. The PID adjustment module is configured to obtain a switching frequency signal by PID control adjustment based on the sampled voltage and a preset control parameter. The PID control adjustment includes a voltage loop control adjustment and a voltage-difference-change-rate loop control adjustment. The control module is configured to form the supply current according to the switching frequency signal.

The present disclosure further discloses a system for adjusting a voltage stabilization output of a power source, including the apparatus for adjusting the voltage stabilization output of the power source as described above and the power source.

The present disclosure further discloses a method for adjusting a voltage stabilization output of a power source, including:
   sampling an output voltage of the power source to obtain a sampled voltage;
   obtaining a switching frequency signal by PID control adjustment based on the sampled voltage and a preset control parameter, with the PID control adjustment including a voltage loop control adjustment and a voltage-difference-change-rate loop control adjustment;
   forming a supply current according to the switching frequency signal.

The present disclosure further discloses a charging control system, including a memory, a processor, and a computer program stored in the memory and executable on the processor. The processor is configured to execute the program to implement the method as described above.

The present disclosure further discloses a computer device, including a memory, a processor, and a computer program stored in the memory and executable on the processor. The processor is configured to execute the program to implement the method as described above.

The present disclosure further discloses a computer-readable medium storing a computer program. When being executed by a processor, the program implements the method as described above.

In the present disclosure, the sampling module samples an output voltage of the power source to obtain a sampled voltage, and the PID adjustment module performs PID control adjustment on the sampled voltage based on a preset control parameter to obtain a switching frequency signal. Therefore, a supply current can be formed according to the switching frequency signal regenerated after the PID control adjustment, thereby enabling the power supply to form the output voltage based on the supply current. In the present disclosure, by sampling the output voltage of the power source, and adjusting the supply current of the output voltage of the power source by the PID control adjustment including the voltage loop control adjustment and voltage-difference-change-rate loop control adjustment, the collection and the control adjustment of the real-time output voltage of the power source can be achieved, thereby ensuring the stabilization output of the power source. In summary, in the present disclosure, the magnitude of the supply current of the power source is precisely controlled through the closed-loop PID control adjustment, thereby precisely controlling the output voltage of the power source, and improving the supply stability of the power source.

BRIEF DESCRIPTION OF THE DRAWINGS

For a clearer illustration of technical features in the embodiments of the present disclosure, a brief description of the drawings for the embodiments will be given below. Obviously, the drawings described below involve only some embodiments of this disclosure. For those of ordinary skill in the art, other drawings can be derived from these drawings without any inventive efforts.

DETAILED DESCRIPTION

The technical solutions in the embodiments of the present disclosure will be clearly and completely described below in conjunction with the drawings. Obviously, those described are merely a part, rather than all, of the embodiments of the present disclosure. All other embodiments derived by persons skilled in the art from the embodiments of the present disclosure without making inventive efforts shall fall within the protection scope of the present disclosure.

In the prior art, it is necessary to ensure the safety and performance reliability of the supply capabilities of various power sources in the power and electronic devices. For example, with the popularization of new energy vehicles, the electricity safety thereof during charging becomes a growing concern. The vehicle charging apparatus requires a stable supply from a power source 10. If the power source 10 is unstable, especially when the power source 10 is short-circuited, important components of the vehicle may be burnt during charging, causing huge economic losses and even casualties in severe cases. So the voltage stabilization control of the power source 10 is a problem urgently to be solved. Therefore, the present disclosure provides a mode for adjusting a voltage stabilization output of a power source, which precisely controls the magnitude of the supply current of the power source 10 by closed-loop PID (proportional, integral and differential) control adjustment, so as to precisely control the output voltage of the power source 10, improve the stability of the output voltage of the power source 10, and ensure the safety and reliability of the power supply device such as the charging apparatus.

Figure 1:
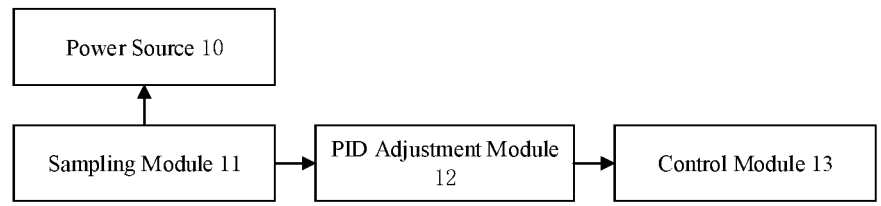
FIG. 1 illustrates a structural diagram of an apparatus for adjusting a voltage stabilization output of a power source according to an embodiment of the present disclosure.

According to an aspect of the present disclosure, an embodiment discloses an apparatus for adjusting a voltage stabilization output of a power source. As illustrated in FIG. 1, in the embodiment, the power source 10 forms an output voltage based on the supply current. The apparatus includes a sampling module 11, a PID adjustment module 12 and a control module 13.

The sampling module 11 is configured to sample the output voltage of the power source 10 to obtain a sampled voltage. The PID adjustment module 12 is configured to obtain a switching frequency signal by PID control adjustment based on the sampled voltage and a preset control parameter. The PID control adjustment includes a voltage loop control adjustment and a voltage-difference-change-rate loop control adjustment. The control module 13 is configured to form a supply current according to the switching frequency signal.

In the present disclosure, the sampling module 11 samples the output voltage of the power source 10 to obtain a sampled voltage, and the PID adjustment module 12 performs PID control adjustment on the sampled voltage based on a preset control parameter to obtain a switching frequency signal. Therefore, a supply current can be formed according to the switching frequency signal regenerated after the PID control adjustment, thereby enabling the power supply 10 to form the output voltage based on the supply current. In the present disclosure, by sampling the output voltage of the power source 10, and adjusting the supply current of the output voltage of the power source 10 by the PID control adjustment including the voltage loop control adjustment and voltage-difference-change-rate loop control adjustment, the collection and the control adjustment of the real-time output voltage of the power source 10 can be achieved, thereby ensuring the stabilization output of the power source 10. In summary, in the present disclosure, the magnitude of the supply current of the power source 10 is precisely controlled by the closed-loop PID control adjustment, thereby precisely controlling the output voltage of the power source 10, and improving the supply stability of the power source.

In an exemplary embodiment, the sampling module is configured to collect the output voltage of the power source to obtain the sampled voltage. A mode of the collection includes at least one selected from the group of a voltage division collection, a Hall effect collection and a voltage division chip collection. In practical applications, the sampled voltage may also be obtained by collecting the output voltage in other modes, which is not limited in the present disclosure. In order to collect the output voltage of the power source 10 in real time and reduce the complexity of signal processing, in an exemplary embodiment, the sampling module 11 is configured to divide the output voltage of the power source 10 to obtain a sampled voltage. Specifically, the output voltage of the power source 10 is collected in proportion by means of voltage division, so that the collected sampled voltage represents the magnitude of the output voltage of the power source 10. Since the sampled voltage is a part of the output voltage collected in a proportion, the large output voltage is converted into a small voltage. Therefore, during subsequent processing of the voltage signal or the current signal, the post-processing signal amount is small, and the voltage stabilization adjustment of the output voltage of the power source 10 can be realized by a simple circuit, without high requirements for circuit elements.

As an exemplary embodiment, the sampling module 11 includes a first resistor group, a second resistor group, a capacitor C1 and an analog-to-digital converter ADC. Each of the first resistor group and the second resistor group includes at least one resistor, and if there are a plurality of the resistors, at least two of which are sequentially connected in series, or connected in parallel and then connected in series with other resistors.

The first resistor group includes a first end connected to a signal output end OUT1 of the power source 10, and a second end connected to a first end of the second resistor group, a first end of the capacitor C1, and the analog-to-digital converter ADC, respectively. The signal output end is configured to output the output voltage. The analog-todigital converter ADC is configured to output the sampled voltage. A second end of the second resistor group and a second end of the capacitor C1 are connected to the ground GND, respectively.

It can be understood that the first resistor group and the second resistor group divide the output voltage of the power source 10, and an analog sampled voltage is obtained through a voltage drop of the first resistor group and transmitted to the analog-to-digital converter ADC. The analog-to-digital converter ADC converts the analog sampled voltage into a digital sampled voltage and then transmits the digital sampled voltage to the PID adjustment module 12 for PID control adjustment. The voltage value of the sampled voltage obtained by voltage division may be obtained based on the resistance values of the first resistor group and the second resistor group and the output voltage. The resistance values of the first resistor group and the second resistor group may be flexibly set by those skilled in the art according to actual requirements for the purpose of adjusting the sampled voltage, which is not limited in the present disclosure.

Figure 2:
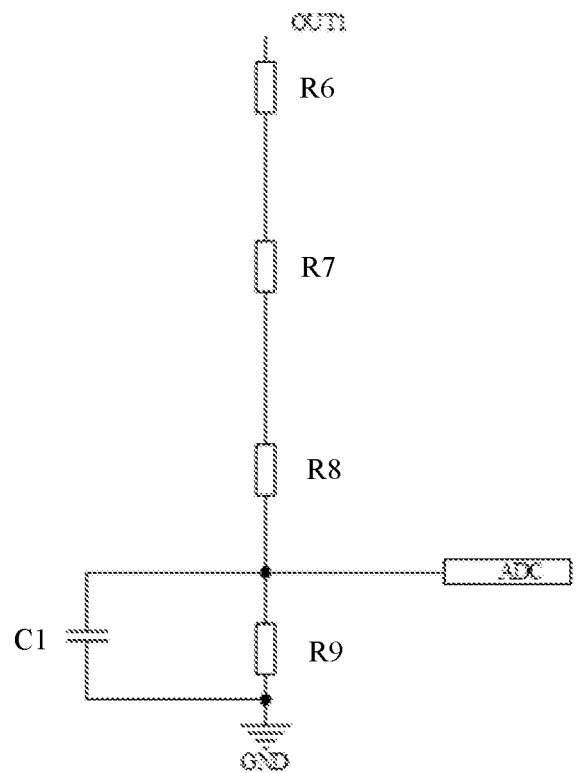
FIG. 2 illustrates a structural diagram of a sampling module of an apparatus for adjusting a voltage stabilization output of a power source according to an embodiment of the present disclosure.

In a specific example, as illustrated in FIG. 2, the sampling module 11 includes a first resistor group, a second resistor group, a capacitor C1 and an analog-to-digital converter ADC. The first resistor group includes a sixth resistor R6, a seventh resistor R7, and an eighth resistor R8. The second resistor group includes a ninth resistor R9. The sixth resistor R6, the seventh resistor R7, and the eighth resistor R8 are sequentially connected in series and then connected to the sampling module 11. That is, a first end of the sixth resistor R6 is connected to the signal output end OUT1 of the power source 10, and a second end thereof is connected to a first end of the seventh resistor R7. A second end of the seventh resistor R7 is connected to a first end of the eighth resistor R8, and a second end of the eighth resistor R8 is connected to a first end of the ninth resistor R9, a first end of the capacitor C1 and the analog-to-digital converter ADC, respectively. A second end of the ninth resistor R9 is connected to the ground GND. The first resistor group is configured as a plurality of resistors connected in series, so that on one hand, the resistance value of the first resistor group can be increased and the sampled voltage can be reduced to facilitate the processing; and on the other hand, by adopting a plurality of resistors connected in series rather than one large resistor, the problem of a large volume can be avoided.

In an exemplary embodiment, in order to achieve a precise PID control adjustment, the preset control parameter includes a target voltage, and the PID adjustment module 12 includes a voltage loop controller for the voltage loop control adjustment and a voltage-difference-change-rate loop controller for the voltage-difference-change-rate loop control adjustment. Exemplarily, the PID adjustment module 12 may be implemented by a microcontroller (MCU).

The voltage loop controller is configured to obtain an actual voltage difference based on the target voltage and the sampled voltage, and obtain a voltage change rate control amplitude based on the actual voltage difference.

The voltage-difference-change-rate loop controller is configured to obtain a target voltage change rate based on the voltage change rate control amplitude, obtain an actual voltage change rate based on the actual voltage difference, and obtain a switching frequency signal based on the target voltage change rate and the actual voltage change rate.

In an optional embodiment, a corresponding target voltage may be set for the sampled voltage, and the actual voltage difference is a difference between the target voltage and the sampled voltage collected in real time. In other embodiments, a corresponding target voltage may also be set for the output voltage of the power source 10 corresponding to the sampled voltage, and the actual voltage difference is a difference between the target voltage and the output voltage converted from the sampled voltage. The sampled voltage may be converted based on relationships between the sampled voltage in the sampling circuit and the resistance values and the output voltages of the first resistor group and the second resistor group. In addition, for the voltage difference obtained in either of the above modes, it is necessary to set a corresponding PID control adjustment algorithm of the PID adjustment module 12 to adjust the input voltage difference to obtain the switching frequency signal. Those skilled in the art can make relevant settings according to actual needs, which will not be described herein.

In order to improve the precision of the PID control adjustment, in the embodiment, the digital sampled voltage output from the analog-to-digital converter ADC is further converted to obtain the actual output voltage. The PID adjustment module 12 further obtains the switching frequency signal by the PID control adjustment based on the obtained output voltage and the preset control parameter.

The voltage loop controller is configured to obtain an actual voltage difference based on the target voltage and the sampled voltage, and obtain a voltage change rate control amplitude based on the actual voltage difference, that is, the voltage loop controller can realize the voltage loop control adjustment. In a specific example, the voltage loop controller may calculate the voltage change rate control amplitude through the following PID control adjustment algorithm.

$$Q(t) = k_p e_c(t) + k_i \int_0^t e_c(t) dt + k_d \frac{de_c(t)}{dt}$$

where Q(t) is a voltage change rate control amplitude at timing t, $k_p$ is a proportional term correction coefficient of the voltage loop controller, $k_i$ is an integral term correction coefficient of the voltage loop controller, $k_d$ is a differential term correction coefficient of the voltage loop controller, and $e_c(t)$ is a difference between a given target voltage Vdt and an actually detected output voltage Vt, i.e., $e_c(t)=(Vt-Vdt)$ $$Pd(t)=(Q(t)-Q(t-1))/dt$$

where Pd (t) is a target voltage change rate at timing t, Q(t) is a voltage change rate control amplitude at timing t, Q(t−1) is a voltage change rate control amplitude at timing t−1, and dt is a period of PID adjustment.

The voltage-difference-change-rate loop controller is configured to obtain a target voltage change rate based on the voltage change rate control amplitude, obtain an actual voltage change rate based on the actual voltage difference, and obtain the switching frequency signal based on the target voltage change rate and the actual voltage change rate, that is, the voltage-difference-change-rate loop controller can realize the voltage-difference-change-rate loop control adjustment. In a specific example, the difference between the target voltage change rate and the actual voltage change rate is input to the voltage-difference-change-rate loop controller, which may calculate the switching frequency signal through the following PID control adjustment algorithm.

$$P(t) = k_{i-p}e_p(t) + k_{i-i}\int_0^t e_p(t)dt + k_{i-d}\frac{de_p(t)}{dt}$$

where P(t) is a switching frequency signal, $k_{i-p}$ a proportional term correction coefficient of the voltage-difference-change-rate loop controller, $k_{i-i}$ is an integral term correction coefficient of the voltage-difference-change-rate loop controller, $k_{i-d}$ is a differential term correction coefficient of the voltage-difference-change-rate loop controller, and $e_P(t)$ is a difference between a given target voltage change rate and the actual voltage change rate. The actual voltage change rate is equal to $e_c/dt$. It should be noted that each coefficient in the embodiment can be selected by those skilled in the art according to experiences, which is not limited in the present disclosure.

In an exemplary embodiment, the control module 13 includes a switching element Q. The control module 13 is configured to control, according to the switching frequency signal, the switching element Q to conduct or cut off a path between a power source end VDD and a supply current output end OUT2, so as to form a supply current. It can be understood that the switching element Q may be controlled to be switched on or switched off according to the switching frequency signal, so as to control whether or not to output the current of the power source end VDD, thereby forming the supply current and adjusting the output voltage of the power source 10.

Figure 3:
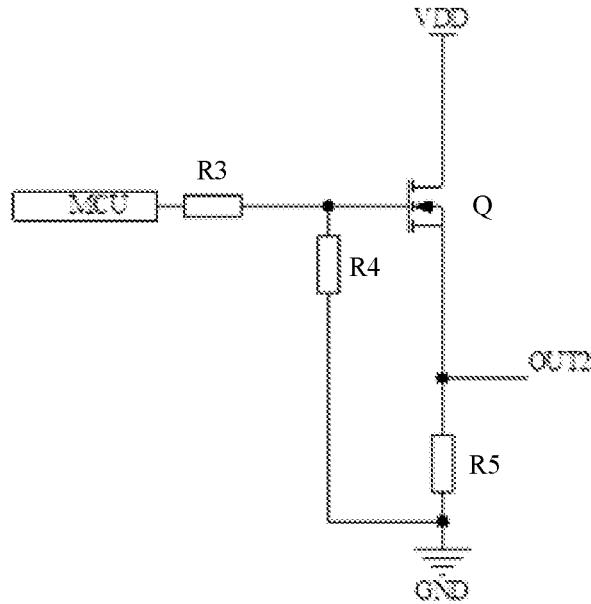
FIG. 3 illustrates a structural diagram of a control module of an apparatus for adjusting a voltage stabilization output of a power source according to an embodiment of the present disclosure.

In a specific example, the control module 13 may be implemented by a specific circuit structure. Specifically, as illustrated in FIG. 3, the control module 13 includes a third resistor R3, a fourth resistor R4, and the switching element Q. The third resistor R3 and the fourth resistor R4 can realize a current limiting function.

The third resistor R3 includes a first end configured to receive the switching frequency signal, and a second end connected to a control end G of the switching element Q. The switching element Q includes a first end D connected to the power source end VDD, and a second end S connected to a first end of the fourth resistor R4 and the supply current output end OUT2, respectively. A second end of the fourth resistor R4 is connected to the ground GND.

It can be understood that the working principle of this specific embodiment is described by taking a first level as a high level, a second level as a low level, and the switching element Q as an NMOS. It should be noted that the embodiment is described by taking the first level as the high level, the second level as the low level, and the switching element Q as the NMOS. In practical applications, by flexibly setting the circuit structure of each module, the first level may also be a low level, the second level may also be a high level, and the switching element Q may also be a PMOS or any other switching element Q capable of realizing the same function, which is not limited in the present disclosure. Therefore, other technical solutions having the same inventive concept as the present disclosure should also fall within the protection scope of the present disclosure.

When the switching frequency signal is at a high level, the switching element Q is switched on in response to the high level, thereby the power supply end VDD is conducted with the supply current output end OUT 2. Under the action of the power source end VDD, the supply current output end OUT2 outputs the supply current to the power source 10 so that the power source 10 outputs a corresponding output voltage. When the switching frequency signal is at a low level, the switching element Q is switched off in response to the low level, the power source end VDD is cut off from the supply current output end OUT2, and there is no output from the supply current output end OUT2. Therefore, according to the present disclosure, the switching frequency signal is obtained according to the output voltage of the power source 10 through the PID control adjustment, and the input of the supply current is controlled through the switching frequency signal, thereby achieving the purpose of adjusting the output voltage of the power source 10, and ensuring the stabilized voltage output of the power source.

In an exemplary embodiment, the control module 13 further includes a fifth resistor R5. The fifth resistor R5 includes a first end connected to the second end of the third resistor R3 and the control end of the switching element Q, respectively, and a second end connected to the ground GND.

It can be understood that the control module 13 further includes a fifth resistor R5, which is an anti-interference pull-down resistor. That is, when the voltage of the switching frequency signal is floated due to interference, the fifth resistor R5 can reduce the voltage of the switching frequency signal under interference to a certain extent, and pulling down the voltage of the switching frequency signal below a threshold voltage of the switching element Q as much as possible, so as to prevent the switching element Q from being switched on by mistake and enhance the anti-interference strength of the control module 13.

It should be noted that as can be understood by those skilled in the art, the switching element Q in the embodiment may be a transistor, including an N-type transistor and a P-type transistor, and various signals at high and low levels should be matched with the model of the transistor to realize the corresponding function. As known to those skilled in the art, a low level signal is required to turn on the P-type transistor, and a high level signal is required to turn on the N-type transistor, so that the N-type transistor or the P-type transistor is used while setting a level of a gate electrode (control end) thereof to realize the corresponding on/off function, thereby achieving the purpose of data reading in the present disclosure. In embodiments of this disclosure, the first end of the transistor may be a source electrode and the second end may be a drain electrode, or vice versa, which is not limited in the present disclosure and may be properly selected according to the type of the transistor.

In addition, the transistor provided by the embodiment of the present disclosure may be a field effect transistor, which may be an enhancement mode field effect transistor or a depletion mode field effect transistor, and is not limited in the present disclosure.

Based on the same principle, the embodiment further discloses a system for adjusting a voltage stabilization output of a power source, which includes the power source and the apparatus for adjusting the voltage stabilization output of the power source according to the embodiment.

Since the principle of the system for solving the problem is similar to that of the above apparatus, the apparatus as described above may be referred to for implementation of the system, and the repetitive description is omitted herein.

Figure 4:
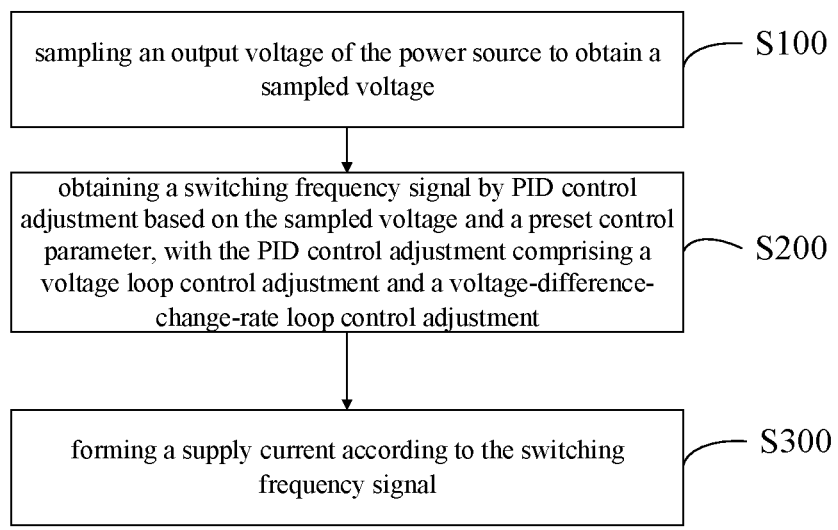
FIG. 4 illustrates a flowchart of a method for adjusting a voltage stabilization output of a power source according to an embodiment of the present disclosure.

Based on the same principle, the embodiment further discloses a method for adjusting a voltage stabilization output of a power source. As illustrated in FIG. 4, in an embodiment, the method includes:

S100: sampling an output voltage of a power source 10 to obtain a sampled voltage.

S200: obtaining a switching frequency signal by PID control adjustment based on the sampled voltage and a preset control parameter, with the PID control adjustment including a voltage loop control adjustment and a voltage-difference-change-rate loop control adjustment.

S300: forming a supply current according to the switching frequency signal.

Figure 5:
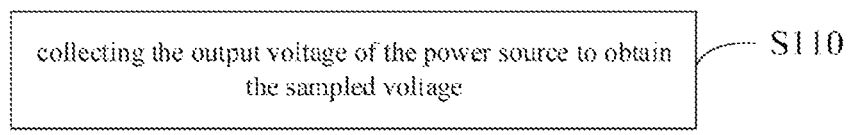
FIG. 5 illustrates a flowchart of S100 of a method for adjusting a voltage stabilization output of a power source according to an embodiment of the present disclosure.

In an exemplary embodiment, as illustrated in FIG. 5, in the S100, sampling the output voltage of a power source 10 to obtain the sampled voltage specifically includes:

S110: collecting the output voltage of the power source 10 to obtain the sampled voltage. A mode of the collection includes at least one selected from the group of a voltage division collection, a Hall effect collection and a voltage division chip collection.

Figure 6:
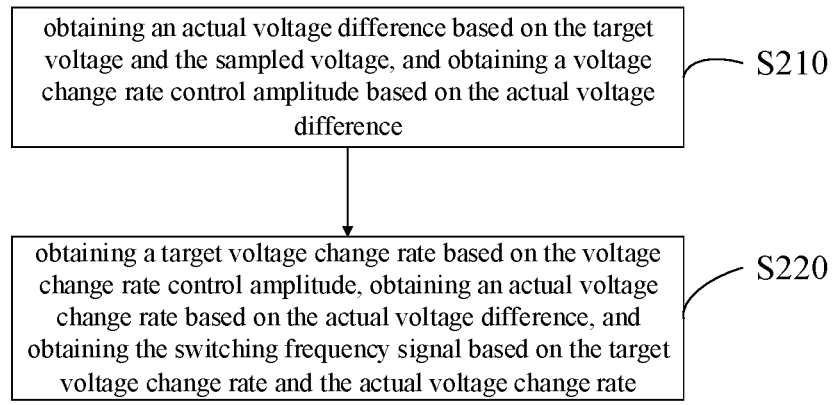
FIG. 6 illustrates a flowchart of S200 of a method for adjusting a voltage stabilization output of a power source according to an embodiment of the present disclosure.

In an exemplary embodiment, as illustrated in FIG. 6, the preset control parameter includes a target voltage, and in the S200, obtaining the switching frequency signal by PID control adjustment based on the sampled voltage and the preset control parameter, with the PID control adjustment including the voltage loop control adjustment and the voltage-difference-change-rate loop control adjustment specifically includes:

S210: obtaining an actual voltage difference based on the target voltage and the sampled voltage, and obtaining a voltage change rate control amplitude based on the actual voltage difference.

S220: obtaining a target voltage change rate based on the voltage change rate control amplitude, obtaining an actual voltage change rate based on the actual voltage difference, and obtaining the switching frequency signal based on the target voltage change rate and the actual voltage change rate.

Figures 7, 8:
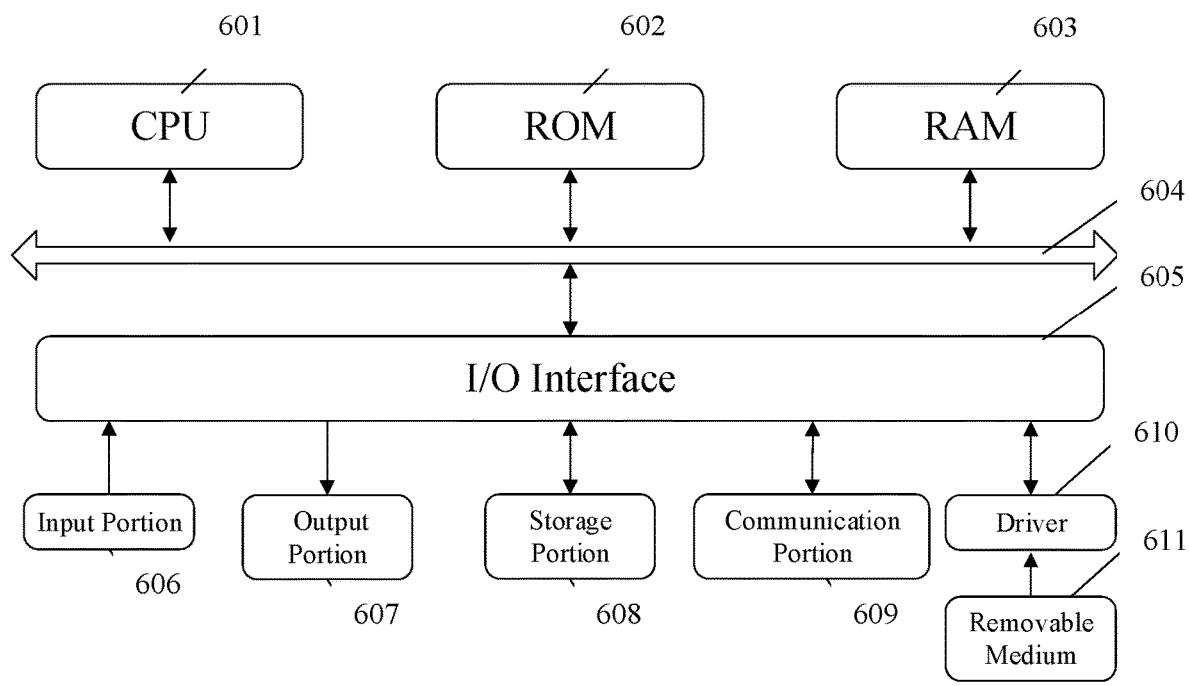
FIG. 7 illustrates a flowchart of S300 of a method for adjusting a voltage stabilization output of a power source according to an embodiment of the present disclosure.
FIG. 8 illustrates a structural diagram of a computer device suitable for implementing an embodiment of the present disclosure.

In an exemplary embodiment, as illustrated in FIG. 7, in the S300, forming the supply current according to the switching frequency signal specifically includes:

S310: controlling, according to the switching frequency signal, the switching element Q to conduct or cut off a path between a power source end VDD and a supply current output end OUT2 to form a supply current.

Since the principle of the method for solving the problem is similar to that of the above apparatus, the apparatus as described above may be referred to for implementation of the method, and the repetitive description is omitted herein.

The system, apparatus, module or unit described forth in the embodiments may be implemented by a computer chip or an entity, or by a product having a certain function, specifically. The present disclosure further discloses a charging control system, including a memory, a processor, and a computer program stored in the memory and executable on the processor, and when the processor is configured to execute the program, to implement the method described in the embodiments. A typical device for implementing is a computer device, and specifically, the computer, for example, a personal computer, a laptop computer, a cellular phone, a camera phone, a smart phone, a personal digital assistant, a media player, a navigation device, an email device, a game console, a tablet computer, a wearable device, or any combination thereof.

In a typical example, the computer device specifically includes a memory, a processor, and a computer program stored in the memory and executable on the processor, and when the processor is configured to execute the program, to implement the above method.

Next, referring to FIG. 8 which illustrates a structural diagram of a computer device 600 suitable for implementing an embodiment of the present disclosure.

As illustrated in FIG. 8, the computer system 600 includes a central processing unit (CPU) 601 which may perform various appropriate works and processing according to a program stored in a read-only memory (ROM) 602 or a program loaded into a random-access memory (RAM) 603 from a storage portion 608. The RAM 603 further stores various of programs and data required for operations by the system 600. The CPU 601, the ROM 602, and the RAM 603 are connected to each other via a bus 604. An input/output (I/O) interface 605 is also connected to the bus 604.

The following components are connected to the I/O interface 605: an input portion 606 including a keyboard, a mouse, etc.; an output portion 607 including a cathode ray tube (CRT), a liquid crystal feedback (LCD), a speaker, etc.; a storage portion 608 including a hard disk, etc.; and a communication portion 609 including a network interface card such as a LAN card, a modem, etc. The communication portion 609 performs communication processing via a network such as the Internet. A driver 610 is also connected to the I/O interface 605 as needed. A removable medium 611, such as a magnetic disk, an optical disk, a magneto-optical disk, a semiconductor memory, etc., is installed on the driver 610 as needed, so that a computer program read therefrom is installed on the storage portion 608 as required.

Particularly, according to an embodiment of the present disclosure, the procedure described above with reference to the flowchart may be implemented as a computer software program. For example, the embodiment of the present disclosure includes a computer program product including a tangibly computer program embodied on a machine-readable medium, and the computer program includes program codes for performing the method illustrated in the flowchart. In such embodiment, the computer programs may be downloaded and installed from a network via the communication part 709, and/or installed from the removable medium 611.

The computer-readable medium includes permanent and non-permanent, removable and non-removable media, which can realize the information storage in any method or technique. The information may be computer readable instructions, data structures, program modules or other data. An example of the computer storage medium includes, but not limited to, a phase change memory (PRAM), a static random access memory (SRAM), a dynamic random access memory (DRAM), other types of random access memory (RAM), a read-only memory (ROM), an electrically-erasable programmable read-only memory (EEPROM), a flash memory or other memory techniques, a compact disk read only memory (CD-ROM), a digital versatile disc (DVD) or other optical storages, magnetic cassette tapes, magnetic diskettes or other magnetic storage device or any other non-transmission medium, which can be used for the storage of information accessible to a computing device. According to the definitions herein, the computer readable medium does not include any temporary computer readable media (transitory media), such as modulated data signal and carrier wave.

For convenience of description, the above-described devices are broken down into various units by functionality. However, the functions of the various units may be realized in one or more hardware elements when implementing the present disclosure.

This disclosure is set forth by referring to flow charts and/or block diagrams for the methods, devices (systems), and computer program products of the embodiments. It should be understood that each process and/or block of the flow charts and/or block diagrams as well as combinations of the processes and/or boxes of the flow charts and/or block diagrams can be realized by computer program instructions. These computer program instructions can be provided to general-purpose computers, special-purpose computers, embedded processors or the processors of other programmable data processing devices to produce a machine, so that an apparatus for implementing the functions designated in one or more processes of the flowcharts and/or one or more blocks of the block diagrams can be produced by the instructions executed by the processor of the computer or other programmable data processing device.

These computer program instructions can also be stored in a computer-readable storage medium which can guide a computer or other programmable data processing device to operate in a particular way, so that an article of manufacture including an instruction apparatus can be produced by the instructions stored in the storage medium, with the instruction apparatus implementing the functions designated in one or more processes of the flowcharts and/or one or more blocks of the block diagram.

These computer program instructions may also be loaded onto a computer or other programmable data processing device to make the computer or other programmable data processing device perform a sequence of computer-implemented operations, so that the instructions executed by the computer or other programmable data processing device realize one or more processes of the flowcharts and/or one or more blocks of the block diagram.

Further to be noted, the term "comprise", "include" or any other words intends to cover the non-exclusive inclusions, so that a process, a method, a commodity or a device including a series of elements includes not only those elements, but also other elements not explicitly listed, or further include inherent elements of such process, method, commodity or device. In a case where there is no further limitation, the elements defined by a sentence "comprising a . . . " do not exclude other identical elements existing in the process, method, commodity or device including the elements.

One skilled in the art should appreciate that the embodiments of the present disclosure can be provided as a method, a system or a computer program product. Therefore, the present disclosure can take the form of a full hardware embodiment, a full software embodiment, or an embodiment combining software and hardware. Moreover, the present invention can take the form of a computer program product implemented on one or more computer usable storage mediums (including, but not limited to, a magnetic disc memory, CD-ROM, optical storage, etc.) including therein computer usable program codes.

The present application may be described in the general context of computer-executable instructions executed by a computer, such as program modules. In general, program modules include routines, programs, objects, components, data structures, etc., that perform specific tasks or implement specific abstract data types. The embodiments of the present disclosure may also be implemented in a distributed computing environment. In these distributed computing environments, tasks are performed by a remote processing device connected via a communication network. In a distributed computing environment, the program modules may be located in local and remote computer storage media, including storage devices.

In this disclosure, the embodiments are described progressively, with the focus being put on differences from other embodiments. For the same or similar parts among the various embodiments, reference may be made to each other. In particular, the system embodiment is described simply, since it is substantially similar to the method embodiment, and please refer to the descriptions of the method embodiment for the relevant portion.

Those described above are just embodiments of the present disclosure, rather than limitations thereto. For those skilled in the art, the present disclosure may have various amendments or variations. Any amendment, equivalent substitution, improvement, etc. made under the spirit and principle of the present disclosure should fall within the scope of the claims of the present disclosure.

The invention claimed is:

1. An apparatus for adjusting a voltage stabilization output of a power source, wherein the power source forms an output voltage based on a supply current, and the apparatus comprises a sampling module, a PID adjustment module and a control module, wherein:
   the sampling module is configured to sample the output voltage of the power source to obtain a sampled voltage;
   the PID adjustment module is configured to obtain a switching frequency signal by PID control adjustment based on the sampled voltage and a preset control parameter, wherein the PID control adjustment comprises a voltage loop control adjustment and a voltage-difference-change-rate loop control adjustment; and
   the control module is configured to form the supply current according to the switching frequency signal.

2. The apparatus for adjusting the voltage stabilization output of the power source according to claim 1, wherein the sampling module is configured to collect the output voltage of the power source to obtain the sampled voltage.

3. The apparatus for adjusting the voltage stabilization output of the power source according to claim 2, wherein a mode of the collection comprises at least one selected from the group of a voltage division collection, a Hall effect collection and a voltage division chip collection.

4. The apparatus for adjusting the voltage stabilization output of the power source according to claim 2, wherein the sampling module comprises a first resistor group, a second resistor group, a capacitor and an analog-to-digital converter, wherein:
   each of the first resistor group and the second resistor group comprises at least one resistor, and if there are a plurality of the resistors, at least two of the plurality of the resistors are sequentially connected in series, or connected in parallel and then connected in series with other resistors;
   the first resistor group comprises a first end connected to a signal output end of the power source, and a second end connected to a first end of the second resistor group, a first end of the capacitor, and the analog-to-digital converter, respectively, wherein the signal output end is configured to output the output voltage;
   the analog-to-digital converter is configured to output the sampled voltage; and
   a second end of the second resistor group and a second end of the capacitor are connected to the ground, respectively.

5. The apparatus for adjusting the voltage stabilization output of the power source according to claim 1, wherein:
   the preset control parameter comprises a target voltage, and the PID adjustment module comprises a voltage loop controller for the voltage loop control adjustment and a voltage-difference-change-rate loop controller for the voltage-difference-change-rate loop control adjustment;

the voltage loop controller is configured to obtain an actual voltage difference based on the target voltage and the sampled voltage, and obtain a voltage change rate control amplitude based on the actual voltage difference; and the voltage-difference-change-rate loop controller is configured to obtain a target voltage change rate based on the voltage change rate control amplitude, obtain an actual voltage change rate based on the actual voltage difference, and obtain a switching frequency signal based on the target voltage change rate and the actual voltage change rate.

6. The apparatus for adjusting the voltage stabilization output of the power source according to claim 1, wherein the control module comprises a switching element, and wherein the control module is configured to control, according to the switching frequency signal, the switching element to conduct or cut off a path between a power source end and a supply current output end to form the supply current.

7. The apparatus for adjusting the voltage stabilization output of the power source according to claim 6, wherein the control module comprises a third resistor, a fourth resistor, and the switching element, and wherein:

the third resistor comprises a first end configured to receive the switching frequency signal, and a second end connected to a control end of the switching element;

the switching element comprises a first end connected to the power source end, and a second end connected to a first end of the fourth resistor and the supply current output end, respectively; and a second end of the fourth resistor is connected to the ground.

8. The apparatus for adjusting the voltage stabilization output of the power source according to claim 7, wherein the control module further comprises a fifth resistor, and wherein the fifth resistor comprises a first end connected to a second end of the third resistor and the control end of the switching element, respectively, and a second end connected to the ground.

9. A system for adjusting a voltage stabilization output of a power source, comprising the apparatus for adjusting the voltage stabilization output of the power source according to claim 1 and the power source.

10. A method for adjusting a voltage stabilization output of a power source, comprising:

sampling an output voltage of the power source to obtain a sampled voltage;

obtaining a switching frequency signal by PID control adjustment based on the sampled voltage and a preset control parameter, with the PID control adjustment comprising a voltage loop control adjustment and a voltage-difference-change-rate loop control adjustment; and forming a supply current according to the switching frequency signal.

11. The method for adjusting the voltage stabilization output of the power source according to claim 10, wherein sampling the output voltage of the power source to obtain the sampled voltage specifically comprises:

collecting the output voltage of the power source to obtain the sampled voltage.

12. The method for adjusting the voltage stabilization output of the power source according to claim 11, wherein a mode of the collection comprises at least one selected from the group of a voltage division collection, a Hall effect collection and a voltage division chip collection.

13. The method for adjusting the voltage stabilization output of the power source according to claim 10, wherein the preset control parameter comprises a target voltage, and wherein obtaining the switching frequency signal by PID control adjustment based on the sampled voltage and the preset control parameter, with the PID control adjustment comprising the voltage loop control adjustment and the voltage-difference-change-rate loop control adjustment, specifically comprises:

obtaining an actual voltage difference based on the target voltage and the sampled voltage, and obtaining a voltage change rate control amplitude based on the actual voltage difference; and obtaining a target voltage change rate based on the voltage change rate control amplitude, obtaining an actual voltage change rate based on the actual voltage difference, and obtaining the switching frequency signal based on the target voltage change rate and the actual voltage change rate.

14. The method for adjusting the voltage stabilization output of the power source according to claim 10, wherein forming the supply current according to the switching frequency signal specifically comprises:

controlling, according to the switching frequency signal, the switching element to conduct or cut off a path between a power source end and a supply current output end to form a supply current.

* * * * *